United States Patent
Lee et al.

(10) Patent No.: US 8,859,311 B2
(45) Date of Patent: Oct. 14, 2014

(54) FLIP-CHIP LIGHT-EMITTING DIODE STRUCTURE AND MANUFACTURING METHOD THEREOF

(71) Applicant: Lextar Electronics Corporation, Hsinchu (TW)

(72) Inventors: Chia-En Lee, Chiayi (TW); Yan-Hao Chen, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/965,277

(22) Filed: Aug. 13, 2013

(65) Prior Publication Data

US 2014/0061700 A1 Mar. 6, 2014

(30) Foreign Application Priority Data

Aug. 30, 2012 (TW) .............................. 101131523 A

(51) Int. Cl.
*H01L 21/00* (2006.01)
*H01L 33/00* (2010.01)

(52) U.S. Cl.
USPC .............................................. 438/31; 257/91

(58) Field of Classification Search
USPC .................... 438/29–31, 48; 257/91, 447, 257/E33.001–E33.077
See application file for complete search history.

(56) References Cited

U.S. PATENT DOCUMENTS

| | | | |
|---|---|---|---|
| 6,614,172 B2 | 9/2003 | Chiu et al. | |
| 6,630,691 B1 | 10/2003 | Mueller-Mach et al. | |
| 7,067,340 B1 | 6/2006 | Tsai et al. | |
| 7,341,878 B2 | 3/2008 | Krames et al. | |
| 7,674,650 B2 * | 3/2010 | Akimoto et al. | 438/104 |
| 8,242,496 B2 * | 8/2012 | Yamazaki et al. | 257/43 |
| 2013/0203194 A1 | 8/2013 | Totani et al. | |

FOREIGN PATENT DOCUMENTS

| | | |
|---|---|---|
| TW | 465123 | 11/2001 |
| TW | 1236161 | 7/2005 |
| TW | 201005991 | 2/2010 |
| TW | 201232815 A1 | 8/2012 |

OTHER PUBLICATIONS

English Abstract translation of TWI236161 (Published Jul. 11, 2005).
TW Office Action dated May 26, 2014.

* cited by examiner

*Primary Examiner* — Calvin Lee
(74) *Attorney, Agent, or Firm* — McClure, Qualey & Rodack, LLP

(57) ABSTRACT

A flip-chip light-emitting diode structure comprises a carrier substrate, a light-emitting die structure, a reflective layer, an aperture, a dielectric layer, a first contact layer and a second contact layer. The light-emitting die structure, located on the carrier substrate, comprises a first type semiconductor layer, a second type semiconductor layer and a light emitting layer. The light emitting layer is formed between the first type and the second type semiconductor layer. The reflective layer is located on the first type semiconductor layer. The aperture penetrates the light-emitting die structure. The dielectric layer covers an inner sidewall of the aperture and extends to a portion of a surface of the reflective layer. The first contact layer is disposed on the part of the reflective layer not covered by the dielectric layer. The second contact layer fills up the aperture and is electrically connected to the second type semiconductor layer.

20 Claims, 9 Drawing Sheets

FLIP-CHIP LIGHT-EMITTING DIODE STRUCTURE AND MANUFACTURING METHOD THEREOF

This application claims the benefit of Taiwan application Serial No. 101131523, filed Aug. 30, 2012, the subject matter of which is incorporated herein by reference.

BACKGROUND OF THE INVENTION

1. Field of the Invention

The invention relates in general to a flip-chip light-emitting diode structure and manufacturing method thereof, and more particularly to a flip-chip light-emitting diode structure with increased luminance efficiency and a manufacturing method thereof.

2. Description of the Related Art

Conventional light-emitting diode element comprises a silicon substrate and a semiconductor composite layer. The semiconductor composite layer comprises a first type semiconductor layer, a light emitting layer and a second type semiconductor layer, which are sequentially formed on the silicon substrate. The silicon substrate can be used as a carrier of a semiconductor composite layer.

However, the light absorption property of the silicon substrate causes the luminance efficiency of light-emitting diode elements to deteriorate.

SUMMARY OF THE INVENTION

The invention is directed to a flip-chip light-emitting diode structure and a manufacturing method thereof. In an embodiment, the silicon substrate can be omitted to increase the luminance efficiency.

According to one embodiment of the present invention, a flip-chip light-emitting diode structure is disclosed. The flip-chip light-emitting diode structure comprises a carrier substrate, a light-emitting die structure, a reflective layer, a first aperture, a dielectric layer, a first contact layer and a second contact layer. The carrier substrate comprises a first and a second electrode. The light-emitting die structure is located on the carrier substrate and comprises a first type semiconductor layer, a second type semiconductor layer and a light emitting layer. The light emitting layer is formed between the first type semiconductor layer and the second type semiconductor layer. The reflective layer is located on the first type semiconductor layer. The first aperture penetrates the first type semiconductor layer, the light emitting layer and the second type semiconductor layer. The dielectric layer covers an inner sidewall of the first aperture and extends to a portion of a surface of the reflective layer. The first contact layer is disposed on the part of the reflective layer not covered by the dielectric layer. The second contact layer is disposed on a portion of the dielectric layer, fills up the first aperture and is electrically connected to the second type semiconductor layer via the first aperture. The first electrode and the second electrode are respectively connected to the first and the second contact layer.

According to another embodiment of the present invention, a manufacturing method of a flip-chip light-emitting diode structure is disclosed. The manufacturing method comprises following steps of: forming a light-emitting die structure on a growth substrate, wherein the light-emitting die structure comprises a second type semiconductor layer formed on the growth substrate, a light emitting layer located on the second type semiconductor layer, and a first type semiconductor layer located on the light emitting layer; forming a first aperture penetrating the first type semiconductor layer, the light emitting layer and the second type semiconductor layer in a predetermined second electrode area; forming a reflective layer on a portion of the first type semiconductor layer; forming a dielectric layer on an inner wall of the first aperture, wherein the dielectric layer extends to a portion of a surface of the reflective layer; forming a first contact layer on the part of the reflective layer not covered by the dielectric layer in a predetermined first electrode area; forming a second contact layer on the dielectric layer, wherein the second contact layer is connected to the second type semiconductor layer via the first aperture; removing the growth substrate to expose the second type semiconductor layer; and overturning the light-emitting die structure to be bonded to a carrier substrate whose surface has a first and a second electrode respectively connected to the first and the second contact layer.

According to an alternate embodiment of the present invention, a manufacturing method of a flip-chip light-emitting diode structure is disclosed. The manufacturing method comprises following steps of: forming a light-emitting die structure on a growth substrate, wherein the light-emitting die structure comprises a first type semiconductor layer located on the growth substrate, a light emitting layer located on the first type semiconductor layer, and a second type semiconductor layer located on the light emitting layer; removing the growth substrate to expose the first type semiconductor layer; forming a first aperture penetrating the first type semiconductor layer and the second type semiconductor layer in a predetermined second electrode area; forming a reflective layer on a portion of the first type semiconductor layer; forming a dielectric layer on an inner wall of the first aperture, wherein the dielectric layer extends to a portion of a surface of the reflective layer; forming a first contact layer on the part of the reflective layer not covered by the dielectric layer in a predetermined first electrode area; forming a second contact layer on the dielectric layer, wherein the second contact layer is connected to the second type semiconductor layer via the first aperture; bonding the light-emitting die structure to a carrier substrate whose surface has a first and a second electrode respectively connected to the first and the second contact layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
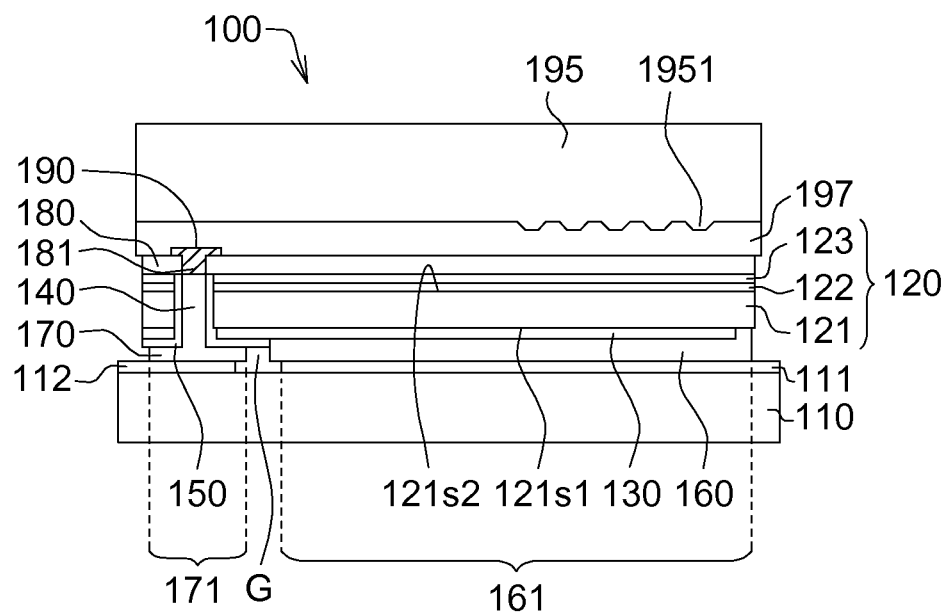
FIG. 1A shows a cross-sectional view of a flip-chip light-emitting diode structure according to an embodiment of the invention.

Referring to FIG. 1A, a cross-sectional view of a flip-chip light-emitting diode structure according to an embodiment of the invention is shown. The flip-chip light-emitting diode structure 100 comprises a carrier substrate 110, a light-emitting die structure 120, a reflective layer 130, a first aperture 140, a dielectric layer 150, a first contact layer 160 and a second contact layer 170.

The carrier substrate 110 is realized by such as a package substrate. The carrier substrate 110 comprises a first electrode 111 and a second electrode 112. The light-emitting die structure 120 is connected to the first electrode 111 through the first contact layer 160 and connected to the second electrode 112 through the second contact layer 170 for electrically connecting the carrier substrate 110.

The light-emitting die structure 120 comprises a first type semiconductor layer 121, a light emitting layer 122 and a second type semiconductor layer 123 sequentially formed on the carrier substrate 110, wherein the light emitting layer 122 is formed between the first type semiconductor layer 121 and the second type semiconductor layer 123.

The light-emitting die structure 120 may be formed by using a common semiconductor manufacturing process (such as thin film deposition, lithography, etching, doping). The first type semiconductor layer 121 is realized by such as a P-type semiconductor layer, and the second type semiconductor layer 123 is realized by such as an N-type semiconductor layer. Alternatively, the first type semiconductor layer 121 is realized by such as an N-type semiconductor layer, and the second type semiconductor layer 123 is realized by such as a P-type semiconductor layer. The P-type semiconductor is realized by a nitrogen-based semiconductor doped with trivalent elements such as boron (B), indium (In), gallium (Ga) or aluminum (Al). The N-type semiconductor is realized by a nitrogen-based semiconductor doped with pentavalent elements such as phosphorus (P), antimony (Ti), arsenic (As). The light emitting layer 122 may be realized by a III-V two-element compound semiconductor, a III-V multi-element compound semiconductor or a II-VI two-element compound semiconductor. Examples of the III-V two-element compound include gallium arsenide (GaAs), indium phosphide (InP), gallium phosphide (GaP), and gallium nitride (GaN). Examples of the III-V multi-element compound include aluminum gallium (AlGaAs), gallium arsenide phosphide (GaAsP), aluminum gallium indium phosphide (AlGaInP), and aluminum indium gallium arsenide (AlInGaAs). Examples of the II-VI two-element compound include cadmium selenide (CdSe), cadmium sulfide (CdS), and zinc selenide (ZnSe).

The reflective layer 130 and the light emitting layer 122 are respectively is formed on a first surface $121s1$ and a second surface $121s2$ of the first type semiconductor layer 121, wherein the first surface $121s1$ and the second surface $121s2$ are disposed oppositely. The reflective layer 130 faces the carrier substrate 110 for reflecting the light entering the carrier substrate 110 to the above. In addition, the reflective layer 130 is realized by such as metal.

In the present example, the first aperture 140 penetrates the entire first type semiconductor layer 121, the entire light emitting layer 122 and the entire second type semiconductor layer 123. That is, the first aperture 140 penetrates the entire light-emitting die structure 120. However, the embodiment of the invention is not limited thereto.

The dielectric layer 150 covers an inner sidewall of the first aperture 140, and extends to a portion of a surface of the reflective layer 130. The dielectric layer 150 separates the second contact layer 170 from the first type semiconductor layer 121 to avoid the second contact layer 170 electrically connecting the first type semiconductor layer 121.

The first contact layer 160 is disposed on the part of the reflective layer 130 not covered by the dielectric layer 150.

The second contact layer 170 is disposed on a portion of the dielectric layer 150. The second contact layer 170 fills up the first aperture 140 and is electrically connected to the second type semiconductor layer 123 via the first aperture 140. A gap G is formed between the second contact layer 170 and the first contact layer 160 to expose a portion of the dielectric layer 150 and dividing the light-emitting die structure into a first electrode area 161 containing the first contact layer 160 and a second electrode area 171 containing the second contact layer 170. The first electrode 111 and the second electrode 112 of the carrier substrate 110 are respectively connected to the first contact layer 160 in the first electrode area 161 and the second contact layer 170 in the second electrode area 171. In addition, the first contact layer 160 and the second contact layer 170 is realized by a metal eutectic material such as silver-tin alloy (Ag—Sn), tin-copper alloy (Sn—Cu), tin-bismuth alloy (Sn—Bi), silver-indium alloy (Ag—In) or other alloy with eutectic points.

Figure 1B:
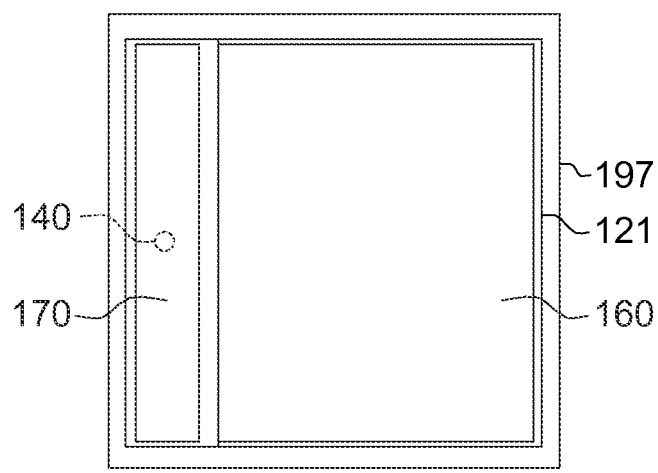
FIG. 1B shows a bottom view of FIG. 1A (not illustrating the carrier substrate)

Referring to FIG. 1B, a bottom view of FIG. 1A (not illustrating the carrier substrate) is shown. Preferably but not restrictively, the areas of the first contact layer 160 and the second contact layer 170 are at least larger than 20% of the entire bottom area of the light-emitting diode structure 100.

As indicated in FIG. 1A, the flip-chip light-emitting diode structure 100 further comprises a transparent material layer 180 and a conductive layer 190. The transparent material layer 180 is formed on the second type semiconductor layer 123, and has a third aperture 181 aligned with the first aperture 140. The conductive layer 190 is formed on the transparent material layer 180 and is connected to the second contact layer 170 of the first aperture 140 via the third aperture 181. Therefore, the second contact layer 170 may be electrically connected to the second type semiconductor layer 123 through the transparent material layer 180 and the conductive layer 190.

The transparent material layer 180 is formed by such as transparent conductive oxide (TCO) or transparent organic conductive material. Examples of transparent conductive oxide are such as indium tin oxide (ITO) and indium zinc oxide (IZO).

The flip-chip light-emitting diode structure 100 further comprises a transparent substrate 195 and a light conversion layer 197. The light conversion layer 197, located between the transparent substrate 195 and the transparent material layer 180, may convert the light emitted from the light-emitting die structure 120 into a light with an expected color. The light conversion layer 197 such as comprises a phosphor (not illustrating) and a transparent sealant (not illustrating), wherein the phosphor is doped in the transparent sealant whose index of refraction ranges between 1.3~2.0 and penetration rate is larger than 85%. However, the exemplification is not for limiting the embodiment of the invention. Alternatively, the light conversion layer 197 comprises a phosphor and a transparent plate, wherein the phosphor is doped in the transparent plate. The transparent plate is such as a mono-crystalline substrate, a polycrystalline substrate, or a substrate formed by transparent quartz, transparent glass or transparent high polymer.

A surface of the transparent substrate 195 further comprises at least one rough structure 1951 adjacent to the light conversion layer 197. The transparent substrate 195 is such as a mono-crystalline substrate, a polycrystalline substrate, or a substrate formed by transparent quartz, transparent glass or transparent high polymer. In the present example, the cross-section of the transparent substrate 195 is a rectangle. In another example, the cross-section of the transparent substrate 195 may be a trapezoid, a triangle, an irregular shape formed by curves or a combination thereof.

Figure 1C:
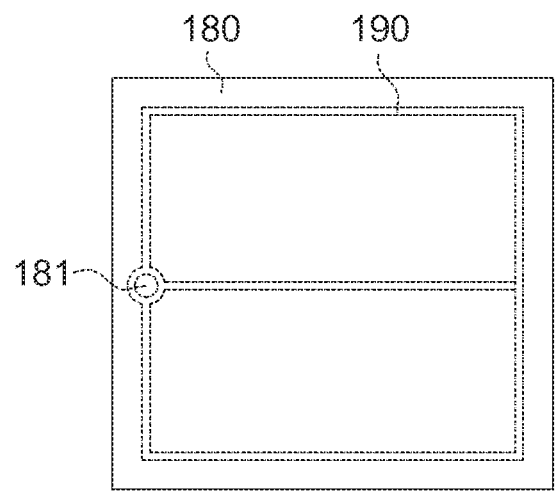
FIG. 1C shows a top view of FIG. 1A (not illustrating the carrier substrate)

Referring to FIG. 1C, a top view of FIG. 1A (not illustrating the carrier substrate) is shown. The conductive layer 190 is a strip-shaped conductive layer, and extends along an edge of the transparent material layer 180. In addition, the conductive layer 190 may be a single- or multi-layered structure formed by a chromium layer, a platinum layer, a gold layer, an aluminum layer or a combination thereof.

Figure 2:
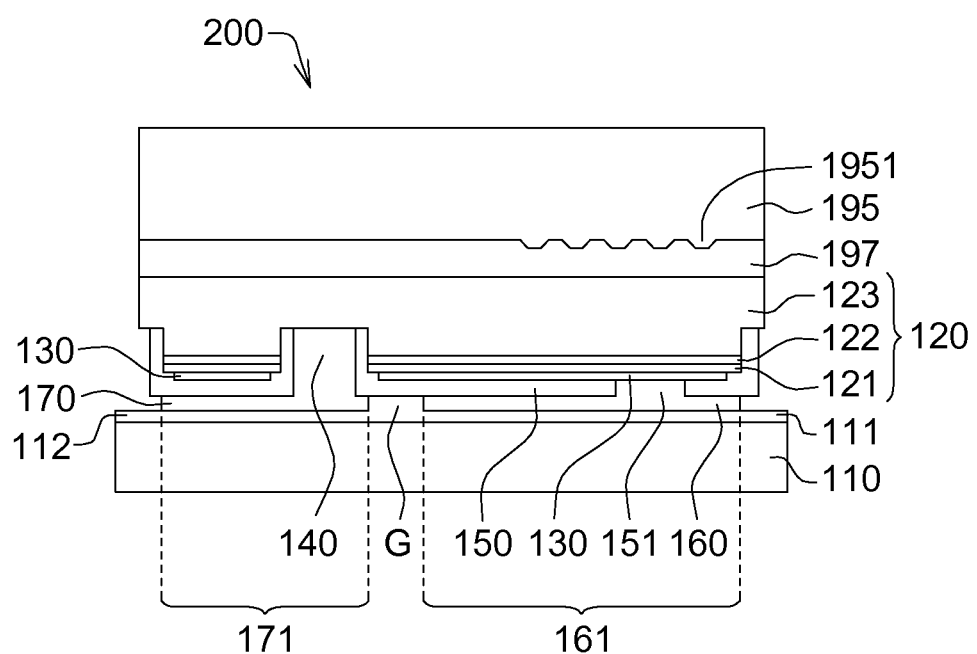
FIG. 2 shows a cross-sectional view of a flip-chip light-emitting diode structure according to another embodiment of the invention.

Referring to FIG. 2, a cross-sectional view of a flip-chip light-emitting diode structure according to another embodiment of the invention is shown. The flip-chip light-emitting diode structure 200 comprises a carrier substrate 110, a light-emitting die structure 120, a reflective layer 130, a first aperture 140, a dielectric layer 150, a first contact layer 160, a second contact layer 170, a transparent material layer 180, a transparent substrate 195 and a light conversion layer 197.

The first aperture 140 penetrates the entire first type semiconductor layer 121, the entire light emitting layer 122 and a portion of the second type semiconductor layer 123. That is, the first aperture 140 only penetrates a portion of the light-emitting die structure 120, not the entire light-emitting die structure 120.

A gap G is formed between the first contact layer 160 and the second contact layer 170 to expose a portion of the dielectric layer 150 and for dividing the light-emitting die structure into a first electrode area 161 containing the first contact layer 160 and a second electrode area 171 containing the second contact layer 170. The dielectric layer 150 has a second aperture 151 disposed in the first electrode area 161 and exposing a portion of the reflective layer 130, wherein the first contact layer 160 is electrically connected to the reflective layer 130 via the second aperture 151. Similarly, the second aperture 151 can also be used in the flip-chip light-emitting diode structure 100.

Referring to FIGS. 3A~3G, processes of manufacturing a flip-chip light-emitting diode structure according to an embodiment of the invention are shown.

Figure 3A:
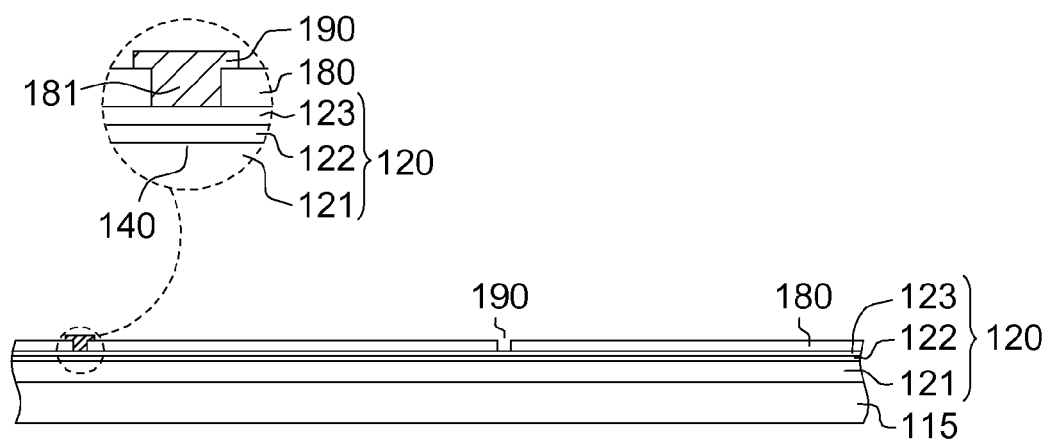
FIGS. 3A~3G show processes of manufacturing a flip-chip light-emitting diode structure according to an embodiment of the invention.

As indicated in FIG. 3A, the light-emitting die structure 120 is formed on the growth substrate 115 by using a semiconductor manufacturing process, wherein the light-emitting die structure 120 comprises a first type semiconductor layer 121, a light emitting layer 122 and a second type semiconductor layer 123. The first type semiconductor layer 121 is formed on the growth substrate 115, the light emitting layer 122 is formed between the first type semiconductor layer 121, and the second type semiconductor layer 123 is formed on the light emitting layer 122. The semiconductor manufacturing process is such as metal organic metal-organic chemical vapor deposition (MOCVD), epitaxy manufacturing process, thin film deposition, lithography, etching process and/or doping process.

As indicated in FIG. 3A, the transparent material layer 180 can be formed on the second type semiconductor layer 123 by using a sputtering process, wherein the transparent material layer 180 has a third aperture 181.

As indicated in FIG. 3A, the conductive layer 190 is formed on the transparent material layer 180 and extends to the interior of the third aperture 181. In another embodiment, the transparent material layer 180 can be omitted. Under such design, the conductive layer 190 is directly formed on the second type semiconductor layer 123.

Figure 3B:
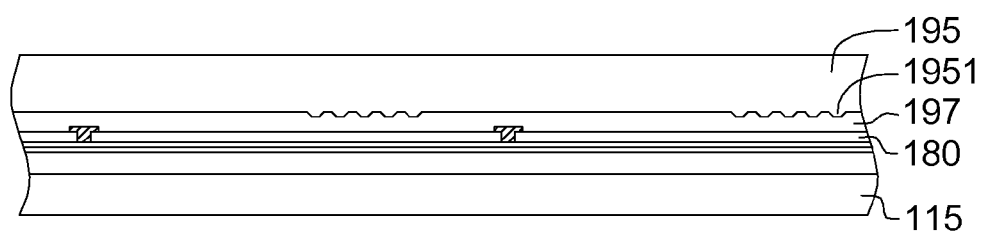

As indicated in FIG. 3B, the light conversion layer 197 is formed on the transparent material layer 180 by using a coating process, wherein the light conversion layer 197 further covers the conductive layer 190. When the transparent material layer 180 is omitted, the light conversion layer 197 is directly formed on the second type semiconductor layer 123. In another example, the light conversion layer 197 can be firstly formed on the transparent material layer 180 and then attached on the second type semiconductor layer 123 through the transparent material layer 180.

As indicated in FIG. 3B, the transparent substrate 195 is formed on the light conversion layer 197 by using a bonding process, wherein the transparent substrate 195 has at least one rough structure 1951 embedded into the light conversion layer 197.

Figure 3C:
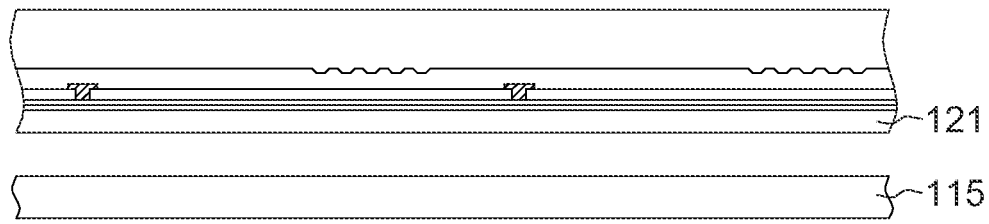

As indicated in FIG. 3C, the growth substrate 115 is removed to expose the first type semiconductor layer 121.

Figure 3D:
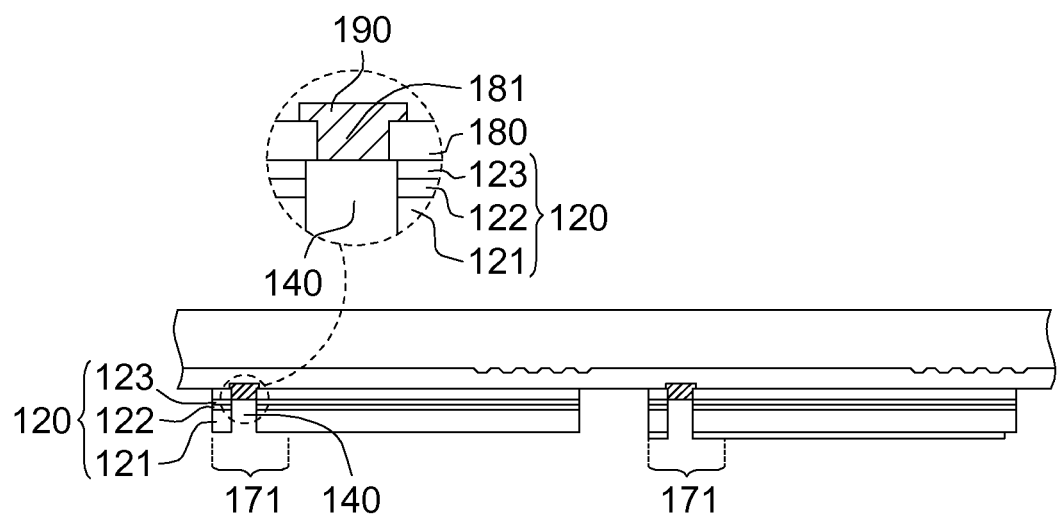

As indicated in FIG. 3D, a first aperture 140 is formed in a pre-determined second electrode area 171, wherein the first aperture 140 penetrates the entire first type semiconductor layer 121, the entire light emitting layer 122 and the entire second type semiconductor layer 123 to expose the conductive layer 190. The first aperture 140 is aligned with the third aperture 181 of the transparent material layer 180, wherein, the area of the aperture of the first aperture 140 is larger than that of the third aperture 181. In another example, the area of the aperture of the first aperture 140 may be equal to or smaller than that of the third aperture 181. In addition, the first aperture 140 and the third aperture 181 can be formed at the same time.

Figure 3E:
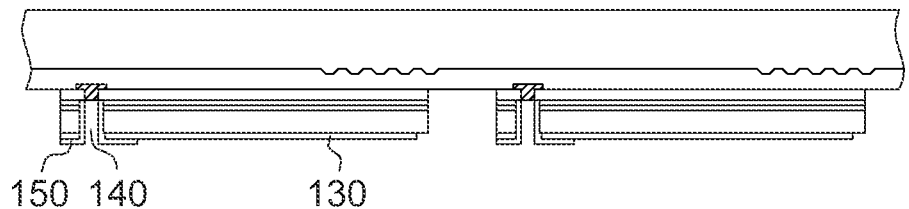

As indicated in FIG. 3E, the reflective layer 130 is formed on a portion of the first type semiconductor layer 121 by using a sputtering process such as printing, spray coating or spin coating.

As indicated in FIG. 3E, the dielectric layer 150 is formed on an inner wall of the first aperture 140 by using a coating process, wherein the dielectric layer 150 extends to a portion of a surface of the reflective layer 130. The dielectric layer 150 separates the first type semiconductor layer 121 from the subsequently formed second contact layer 170. In the present example, the dielectric layer 150 is a thin layer not filling up the first aperture 140.

Figure 3F:
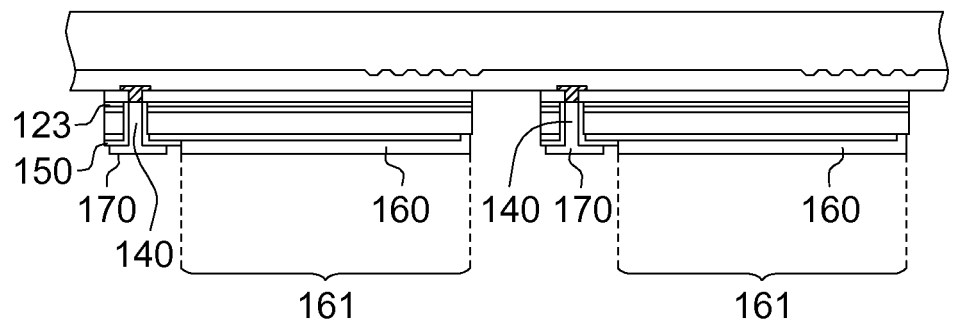

As indicated in FIG. 3F, a first contact layer 160 is formed in pre-determined first electrode area 161 on the reflective layer 130.

As indicated in FIG. 3F, the second contact layer 170 is formed on the dielectric layer 150 and is connected to the second type semiconductor layer 123 via the first aperture 140. The dielectric layer 150 avoids the second contact layer 170 electrically connecting the first type semiconductor layer 121.

Figure 3G:
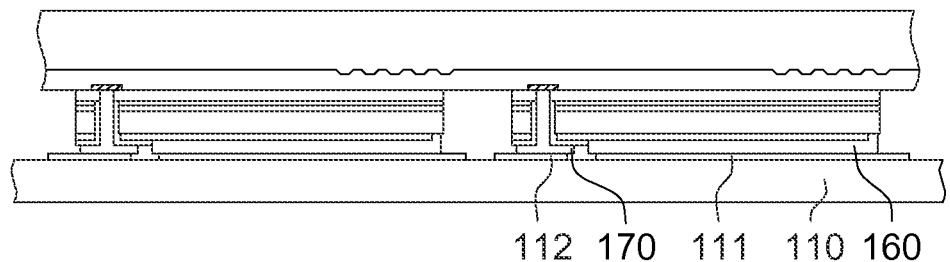

As indicated in FIG. 3G, the light-emitting die structure 120 is disposed on the carrier substrate 110 whose surface comprises a first electrode 111 and a second electrode 112. The light-emitting die structure 120 is bonded to the carrier substrate 110 through the first contact layer 160 located in the first electrode area 161 and the second contact layer 170 located in the second electrode area 162. To put it in greater details, the light-emitting die structure 120 is connected to the first electrode 111 through the first contact layer 160 and connected to the second electrode 112 through the second contact layer 170 for electrically connecting to the carrier substrate 110.

Then, the structure of FIG. 3G is divided to form at least one flip-chip light-emitting diode structure 100 as indicated in FIG. 1A. In another example, the dividing step can be performed prior to the bonding step (FIG. 3G).

Referring to FIGS. 4A~4G, processes of manufacturing a flip-chip light-emitting diode structure according to another embodiment of the invention are shown.

Figure 4A:
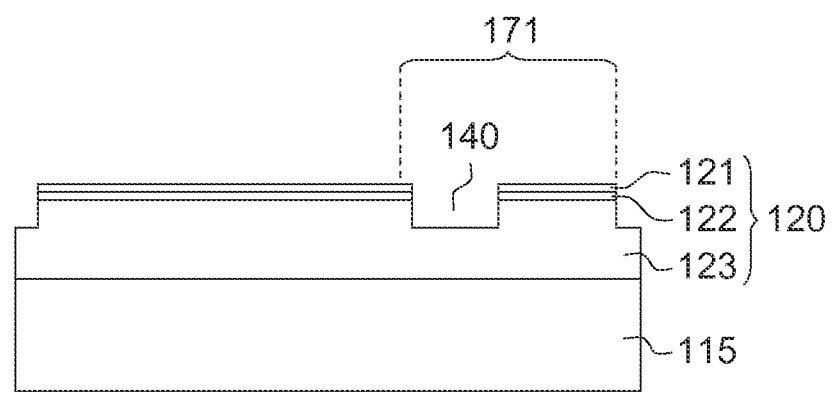
FIGS. 4A~4G show processes of manufacturing a flip-chip light-emitting diode structure according to another embodiment of the invention.

As indicated in FIG. 4A, the light-emitting die structure 120 is formed on the growth substrate 115 by using an epitaxy technology, wherein the light-emitting die structure 120 comprises a first type semiconductor layer 121, a light emitting layer 122 and a second type semiconductor layer 123. The second type semiconductor layer 123 is formed on the growth substrate 115, the light emitting layer 122 is formed on the second type semiconductor layer 123, and the first type semiconductor layer 121 is formed on the light emitting layer 122.

As indicated in FIG. 4A, the first aperture 140 is formed in the pre-determined second electrode area 171, wherein the first aperture 140 penetrates the entire first type semiconductor layer 121, the entire light emitting layer 122 and a portion of the second type semiconductor layer 123.

Figure 4B:
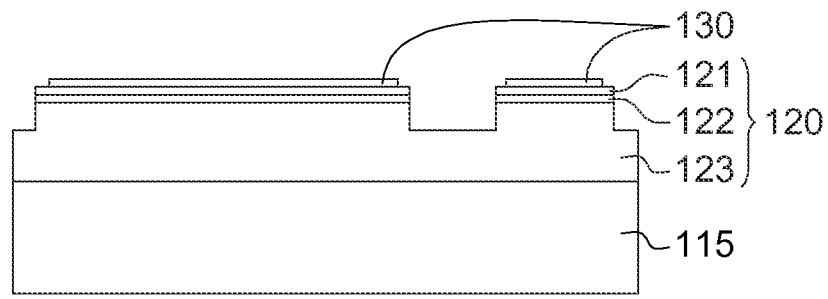

As indicated in FIG. 4B, the reflective layer 130 is formed on a portion of the first type semiconductor layer 121.

Figure 4C:
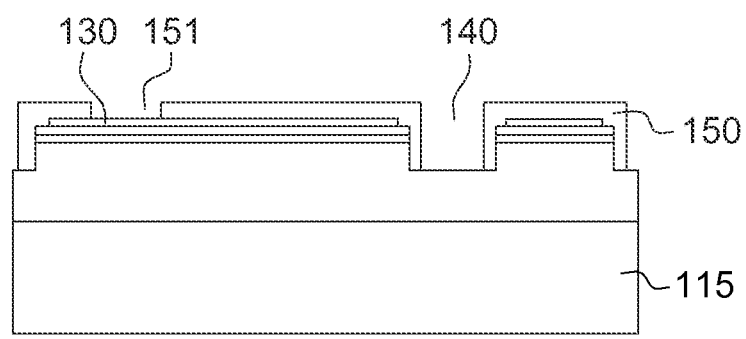

As indicated in FIG. 4C, the dielectric layer 150 is formed on an inner wall of the first aperture 140, wherein the dielectric layer 150 extends to a portion of a surface of the reflective layer 130. The dielectric layer 150 separates the first type semiconductor layer 121 from the subsequently formed second contact layer 170. In the present, the dielectric layer 150 is a thin layer not filling up the first aperture 140.

As indicated in FIG. 4C, the second aperture 151 is formed on a portion of the dielectric layer 150 to expose a portion of a surface of the reflective layer 130, so that the subsequently formed first contact layer 160 is connected to the reflective layer 130 via the second aperture 151.

Figure 4D:
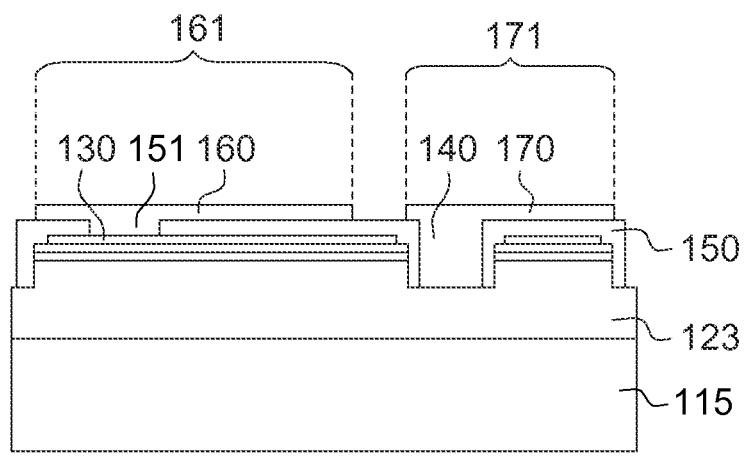

As indicated in FIG. 4D, the first contact layer 160 is formed on the reflective layer 130 in a pre-determined first electrode area 161.

As indicated in FIG. 4D, the second contact layer 170 is formed on the dielectric layer 150 in the pre-determined second electrode area 171 and is connected to the second type semiconductor layer 123 via the first aperture 140. The dielectric layer 150 avoids the second contact layer 170 electrically short-circuiting the first type semiconductor layer 121.

Figure 4E:
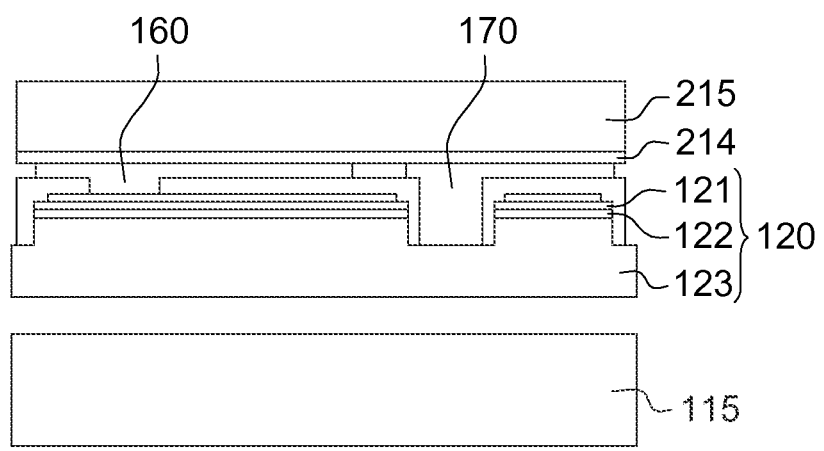

As indicated in FIG. 4E, the growth substrate 115 is removed to expose the second type semiconductor layer 123. Before the growth substrate 115 is removed, a temporary substrate 215 having an adhesive layer 214 can be used for adhering the first contact layer 160 and the second contact layer 170 so that the growth substrate 115 can be removed more easily.

Figure 4F:
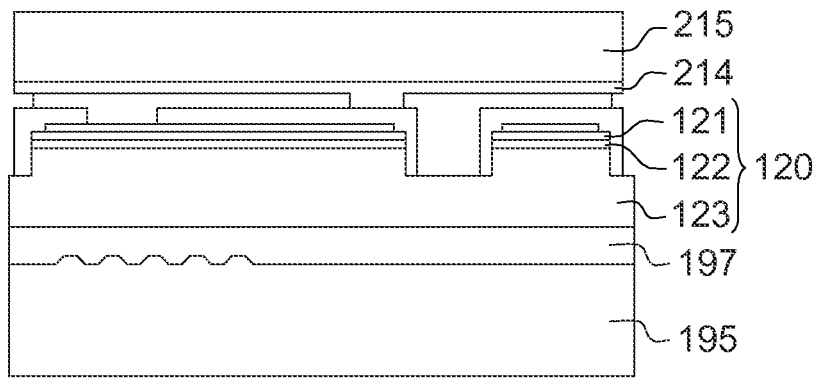
Figure 4G:
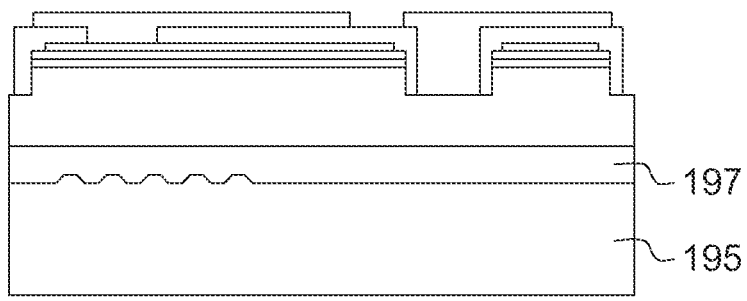

As indicated in FIG. 4F, the light conversion layer 197 is formed on the second type semiconductor layer 123 by using a coating process.

As indicated in FIG. 4F, the transparent substrate 195 is formed on the light conversion layer 197 by using a bonding process. The transparent substrate 195 has at least one rough structure 1951 embedded into the light conversion layer 197.

Then, the temporary substrate 215 and the light-emitting die structure 120 are separated to expose the first contact layer 160 and the second contact layer 170.

Then, the light-emitting die structure 120 is overturned, so that the first contact layer 160 and the second contact layer 170 face downwards to be bonded to the carrier substrate 110 whose surface comprises the first electrode 111 and the second electrode 112 through the first contact layer 160 located on the first electrode area 161 and the second contact layer 170 the second electrode area 171. Thus, at least one flip-chip light-emitting diode structure 200 as indicated in FIG. 2 is formed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a flip-chip light-emitting diode structure, wherein the method comprises:
    forming a light-emitting die structure on a growth substrate, wherein the light-emitting die structure comprises a first type semiconductor layer formed on the growth substrate, a light emitting layer formed on the first type semiconductor layer, and a second type semiconductor layer formed on the light emitting layer;
    removing the growth substrate to expose the first type semiconductor layer;
    forming a first aperture penetrating the first type semiconductor layer and the second type semiconductor layer in a predetermined second electrode area;
    forming a reflective layer on a portion of the first type semiconductor layer;
    forming a dielectric layer on an inner wall of the first aperture, wherein the dielectric layer extends to a portion of a surface of the reflective layer;
    forming a first contact layer on the part of the reflective layer not covered by the dielectric layer in a predetermined first electrode area;
    forming a second contact layer on the dielectric layer, wherein the second contact layer is connected to the second type semiconductor layer via the first aperture; and
    bonding the light-emitting die structure to a carrier substrate whose surface has a first and a second electrode respectively connected to the first and the second contact layer.

2. The manufacturing method according to claim 1, wherein after the step of forming the dielectric layer on the inner wall of the first aperture, the method further comprises forming a second aperture to expose the reflective layer, so that the first contact layer is connected to the reflective layer via the second aperture.

3. The manufacturing method according to claim 1, wherein in the step of forming the first aperture, the first aperture penetrates the entire thickness of the second type semiconductor layer.

4. A manufacturing method of a flip-chip light-emitting diode structure,
    wherein the method comprises:
    forming a light-emitting die structure on a growth substrate, wherein the light-emitting die structure comprises a second type semiconductor layer formed on the growth substrate, a light emitting layer located on the second type semiconductor layer, and a first type semiconductor layer located on the light emitting layer;
    forming a first aperture penetrating the first type semiconductor layer, the light emitting layer and the second type semiconductor layer in a predetermined second electrode area;
    forming a reflective layer on a portion of the first type semiconductor layer;
    forming a dielectric layer on an inner wall of the first aperture, wherein the dielectric layer extends to a portion of a surface of the reflective layer;
    forming a first contact layer on the part of the reflective layer not covered by the dielectric layer in a predetermined first electrode area;

forming a second contact layer on the dielectric layer, wherein the second contact layer is connected to the second type semiconductor layer via the first aperture;

removing the growth substrate to expose the second type semiconductor layer; and overturning the light-emitting die structure to be bonded to a carrier substrate whose surface has a first and a second electrode respectively connected to the first and the second contact layer.

5. The manufacturing method according to claim 4, wherein the first and the second contact layer are respectively formed by a metal eutectic material.

6. The manufacturing method according to claim 4, further comprising:

forming a transparent material layer on the second type semiconductor layer, wherein the transparent material layer has a third aperture aligned with the first aperture; and forming a conductive layer on the transparent material layer, wherein the conductive layer extends to the interior of the third aperture;

wherein, the third aperture aligned with the first aperture is formed to directly penetrate the light-emitting die structure in the step of forming the first aperture, or the third aperture is formed on the transparent material layer after the first aperture is formed.

7. The manufacturing method according to claim 6, wherein the conductive layer is a strip-shaped conductive layer extending along an edge of the transparent material layer.

8. The manufacturing method according to claim 7, further comprising:

forming a light conversion layer on the second type semiconductor layer.

9. The manufacturing method according to claim 8, further comprising:

a transparent substrate having a rough structure embedded into the light conversion layer.

10. The manufacturing method according to claim 8, wherein the light conversion layer is directly formed on the second type semiconductor layer, or the light conversion layer is firstly formed on the transparent material layer and then attached on the second type semiconductor layer.

11. The manufacturing method according to claim 10, wherein in the step of forming the first aperture, the first aperture penetrates a portion of the thickness of the second type semiconductor layer.

12. A flip-chip light-emitting diode structure, comprising:
a carrier substrate having a first and a second electrode;
a light-emitting die structure located on the carrier substrate and comprising:
  a first type semiconductor layer;
  a second type semiconductor layer; and
  a light emitting layer formed between the first type semiconductor layer and the second type semiconductor layer;
a reflective layer formed on the first type semiconductor layer;
a first aperture penetrating the first type semiconductor layer, the light emitting layer and the second type semiconductor layer;
a dielectric layer covering an inner sidewall of the first aperture and extending to a portion of a surface of the reflective layer;
a first contact layer disposed on the part of the reflective layer not covered by the dielectric layer; and
a second contact layer disposed on a portion of the dielectric layer, wherein the second contact layer fills up the first aperture and is electrically connected to the second type semiconductor layer via the first aperture;
wherein, the first electrode and the second electrode are connected to the first and the second contact layer respectively.

13. The flip-chip light-emitting diode structure according to claim 12, wherein the first aperture penetrates a portion or the entire of the second type semiconductor layer.

14. The flip-chip light-emitting diode structure according to claim 12, wherein the first and the second contact layer are formed by a metal eutectic material.

15. The flip-chip light-emitting diode structure according to claim 12, wherein a gap is formed between the first and the second contact layer to expose a portion of the dielectric layer and divide the light-emitting die structure into a first electrode area containing the first contact layer and a second electrode area containing the second contact layer.

16. The flip-chip light-emitting diode structure according to claim 15, wherein the first electrode area further comprises a second aperture located on the dielectric layer to expose a portion of the reflective layer, and the first contact layer is electrically connected to the reflective layer via the second aperture.

17. The flip-chip light-emitting diode structure according to claim 12, wherein the flip-chip light-emitting diode structure further comprises:
a transparent material layer formed on the second type semiconductor layer and having a third aperture aligned with the first aperture; and
a conductive layer formed on the transparent material layer and connected to the second contact layer formed in the first aperture via the third aperture.

18. The flip-chip light-emitting diode structure according to claim 17, wherein the conductive layer is a strip-shaped conductive layer and extends along an edge of the transparent material layer.

19. The flip-chip light-emitting diode structure according to claim 18, further comprising:
a transparent substrate; and
a light conversion layer located between the transparent material layer and the transparent substrate.

20. The flip-chip light-emitting diode structure according to claim 19, wherein the transparent substrate further comprises a rough structure embedded into the light conversion layer.

* * * * *